(12) United States Patent
Choi et al.

(10) Patent No.: US 9,510,446 B2
(45) Date of Patent: Nov. 29, 2016

(54) PRINTED CIRCUIT BOARD AND MANUFACTURE METHOD THEREOF

(71) Applicant: Tyco Electronics AMP Korea Ltd., Kyungsangbuk-do (KR)

(72) Inventors: Yang Yun Choi, Gyeonggi-do (KR); Maeng Goun Youn, Chungcheongbuk-do (KR)

(73) Assignee: Tyco Electronics AMP Korea Ltd., Kyungsangbuk-Do (KR)

( * ) Notice: Subject to any disclaimer, the term of this patent is extended or adjusted under 35 U.S.C. 154(b) by 96 days.

(21) Appl. No.: 14/506,170

(22) Filed: Oct. 3, 2014

(65) Prior Publication Data

US 2015/0021072 A1     Jan. 22, 2015

Related U.S. Application Data

(63) Continuation of application No. PCT/KR2013/002746, filed on Apr. 3, 2013.

(30) Foreign Application Priority Data

Apr. 5, 2012 (KR) .................... 10-2012-0035382
Apr. 2, 2013 (KR) .................... 10-2013-0035716

(51) Int. Cl.
*H05K 1/09* (2006.01)
*H05K 1/02* (2006.01)
(Continued)

(52) U.S. Cl.
CPC ............. *H05K 1/09* (2013.01); *H05K 3/022* (2013.01); *H05K 3/244* (2013.01); *H05K 3/427* (2013.01);
(Continued)

(58) Field of Classification Search
CPC ........ H05K 1/09; H05K 3/10; H05K 3/4673; H05K 3/429; H05K 1/115; H05K 1/0298
USPC ............................... 174/257; 29/17.3
See application file for complete search history.

(56) References Cited

U.S. PATENT DOCUMENTS 3,936,548 A * 2/1976 Konicek ............ C25D 3/38
156/155
4,767,674 A * 8/1988 Shirai ................ B32B 15/08
257/E23.006

(Continued)

FOREIGN PATENT DOCUMENTS

EP       746189 A1 * 12/1996
JP       11087886   *  3/1999
(Continued)

OTHER PUBLICATIONS

Derwent 1999-273904 is equivalent to JP 11087886 A_H and is an English summary of JP 11087886 A_I.*

(Continued)

*Primary Examiner* — Timothy Thompson
*Assistant Examiner* — Charles Pizzuto
(74) *Attorney, Agent, or Firm* — Barley Snyder

(57) ABSTRACT

A printed circuit board is disclosed having a substrate with an insulating layer, aluminum foil layers disposed on both sides of the insulating layer, and a through-hole formed in the insulating layer and aluminum foil layers. A metal layer is disposed over an exposed surface of the insulating layer positioned along an inner surface of the through-hole. A zinc film is positioned on a surface of the aluminum foil. A metal film is disposed over the zinc film. A plating film is disposed on a surface of the metal film. A circuit pattern is etched through the aluminum foil and the plating film.

25 Claims, 4 Drawing Sheets

(51) Int. Cl.
*H05K 3/42* (2006.01)
*H05K 1/11* (2006.01)
*H05K 3/10* (2006.01)
*H05K 3/46* (2006.01)
*H05K 3/02* (2006.01)
*H05K 3/24* (2006.01)
*H05K 3/06* (2006.01)
*H05K 3/38* (2006.01)

(52) U.S. Cl.
CPC ........... *H05K 1/0207* (2013.01); *H05K 1/0209* (2013.01); *H05K 3/06* (2013.01); *H05K 3/383* (2013.01); *H05K 2201/0323* (2013.01); *H05K 2201/0338* (2013.01); *H05K 2201/0355* (2013.01); *H05K 2203/073* (2013.01); *H05K 2203/0723* (2013.01); *H05K 2203/1394* (2013.01); *Y10T 29/302* (2015.01)

(56) References Cited

U.S. PATENT DOCUMENTS

| | | | | |
|---|---|---|---|---|
| 5,473,109 A | * | 12/1995 | Plankl | H05K 5/0047 174/363 |
| 5,633,069 A | * | 5/1997 | Shimizu | H05K 3/0014 428/192 |
| 5,886,399 A | * | 3/1999 | Ohsawa | H01L 23/16 257/503 |
| 7,681,310 B2 | | 3/2010 | Chinda et al. | |
| 2004/0142154 A1 | * | 7/2004 | Tomekawa | B32B 15/04 428/209 |
| 2008/0213550 A1 | * | 9/2008 | Watanabe | B41C 1/1066 428/195.1 |
| 2009/0277679 A1 | | 11/2009 | Jung et al. | |
| 2010/0139961 A1 | * | 6/2010 | Kim | B32B 15/08 174/258 |
| 2010/0186998 A1 | * | 7/2010 | Tai | B32B 15/08 174/254 |
| 2010/0230142 A1 | | 9/2010 | Bamba et al. | |
| 2012/0058276 A1 | * | 3/2012 | Uchida | C23C 18/1601 427/309 |

FOREIGN PATENT DOCUMENTS

| | | |
|---|---|---|
| JP | 2004-179291 A | 6/2004 |
| JP | 2004-330701 A | 11/2004 |
| KR | 10-2009-0079329 | 7/2009 |
| KR | 20100135603 | * 12/2010 |

OTHER PUBLICATIONS

International Search Report issued in co-pending PCT/KR2013/002746 application, dated Jul. 12, 2013, 4 pages.

* cited by examiner

PRINTED CIRCUIT BOARD AND MANUFACTURE METHOD THEREOF

CROSS-REFERENCE TO RELATED APPLICATION

This application is a continuation of PCT Application No. PCT/KR2013/002746, filed Apr. 3, 2013, which claims priority to Korean Patent Application No. 10-2012-0035382, filed Apr. 5, 2012, and Korean Patent Application No. 10-2013-0035716, filed Apr. 2, 2013.

FIELD OF THE INVENTION

The invention is generally related to a printed circuit board, and more specifically to a printed circuit board having aluminum layers.

BACKGROUND

In general, a printed circuit board ("PCB") refers to a component onto which various elements are mounted or electrically connected through integrated wiring. With technological development, the PCBs are being manufactured in various forms and with various functions including home appliances, communication devices, semiconductor devices, industrial devices, and electric vehicle control. As technological advances increasingly reduce the size of electronic components, PCBs are also becoming smaller, lighter, and higher value-added. Additionally, as the size of electronic components is reduced, PCBs are increasingly becoming multifunctional, with greater numbers of electronic components being connected on smaller and smaller PCBs.

A consequence of this multifunctional application is that the electronic devices consume more power, generating more heat. This heat generation can often determine user satisfaction and purchase criteria.

Conventionally, a multilayer PCB is manufactured by preparing a copper clad laminate (CCL) as a base substrate and accumulating a copper foil on which a circuit pattern is formed. The drawback of the convention copper (Cu) based multilayered PCB is that methods for increasing the efficiency of heat dissipation is limited.

Recently, aluminum (Al) based multilayer PCBs have been explored as a potential replacement to the Cu based multilayer PCBs, because Al has a higher thermal conductivity than Cu.

Japanese Patent Publication No. 2004-179291 discloses an example of an Al based PCB, which increases heat radiation efficiency and flexural strength by replacing the insulating layers with Al, and includes circuits disposed on both sides. Surface roughness is formed by through-hole processing. Also, the entire part is turned to a nonconductor. Al with both poles oxidized is brought into close contact with a coating layer of the through-hole, and circuits are formed on both sides of the Al. Both poles of the Al may be oxidized by depth of 10 to 100 μm. When the depth is 30 μm, the Al is not affected by electric shock and insulation efficiency is excellent.

A drawback of this approach is that a surface of the Al core may be corroded and undesired chemical reactions may occur during electrolytic reduction Cu plating, because Al has lower chemical resistance than Cu and is in an active ion state. The Cu layer generated by electrolytic reduction Cu plating may not completely achieve close contact with an Al core layer disposed under the Cu layer. Additionally, even after the Cu plating, a surface of the Cu layer may float due to a poor contacting force, accordingly reducing reliability of the product.

When the Al based PCB manufactured by the conventional method is used for office automation equipments, mobile terminals, and similar applications having an applied temperature range that is relatively narrow, the contacting force of the Cu layer may be stabilized by anodizing the Al core. However, when the Al based PCB is used in electronic control applications in vehicles, especially when mounting in an engine compartment, the applied temperature range is very large, resulting in degradation between an Al film and the Cu layer.

In addition, when the substrate is used for vehicles, the PCB may be damaged due to a difference in thermal expansion rate between the Al core and other layers disposed on the Al core.

SUMMARY

A printed circuit board has a substrate with an insulating layer, aluminum foil layers disposed on both sides of the insulating layer, and a through-hole formed in the insulating layer and aluminum foil layers. A metal layer is disposed over an exposed surface of the insulating layer positioned along an inner surface of the through-hole. A zinc film is positioned on a surface of the aluminum foil. A metal film is disposed over the zinc film. A plating film is disposed on a surface of the metal film. A circuit pattern is etched through the aluminum foil and the plating film.

BRIEF DESCRIPTION OF DRAWINGS

The invention will now be described by way of example, with reference to the accompanying Figures, of which.

DETAILED DESCRIPTION OF THE PREFERRED EMBODIMENTS

Figure 1:
FIGS. 1 to 11 show sectional views of a processes of manufacturing a PCB.

Reference will now be made in detail to embodiments of the present invention, examples of which are illustrated in the accompanying drawings, wherein like reference numerals refer to the like elements throughout. The embodiments are described below in order to explain the present invention by referring to the figures.

In the embodiment shown in FIG. 1, an aluminum (Al) foil 10 is prepared by introducing surface roughness on a surface of the Al foil 10 to increase bonding efficiency. In an exemplary embodiment, the surface roughness may be formed by etching with alkali-based or acid-based chemical processing methods, such as sulfate-based soft etching performed for about one minute. While general anodizing methods require about 6 to 10 hours, soft etching considerably reduces the time required for forming the surface roughness.

Figure 2:
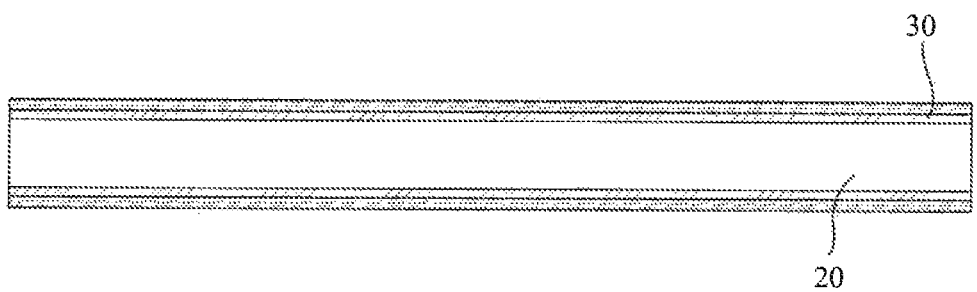

In the embodiment shown in FIG. 2, the Al foil 10 is bonded to an insulating layer 20 using polyimide-based or epoxy-based adhesive having high bonding capabilities and insulating properties. In an exemplary embodiment, the Al foil 10 shown in FIG. 1 may be bonded using a polyimide-based insulating bonding sheet 30. The polyimide-based bonding sheet may have a similar thermal expansion coefficient as the Al foil 10. Since polyimide is stable at high temperatures of about 400° C. or more to a low temperature of about −269° C. or lower, variation according to the thermal expansion coefficient (23.03×10−6) of Al may be absorbed. Bonding of the Al foil 10 and the insulating layer 20 may be performed by heating or pressurizing an upper portion and a lower portion of the Al foil 10.

Figure 3:
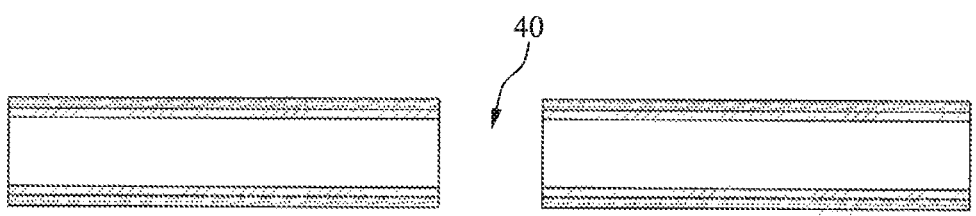

In the embodiment shown in FIG. 3, a through-hole 40 is formed to pass through from the insulating layer 20 to the Al foil 10. The through-hole 40 may be formed by drilling, punching by laser processing, chemical etching, or other techniques known to those of ordinary skill in the art. Although in one embodiment the through-hole 40 is formed after bonding of the Al foil 10 and the insulating layer 20 in the above description, in other embodiments the through-holes 40 may be formed separately in the Al foil 10 and the insulating layer 20, prior to the Al foil 10 and the insulating layer 20 being bonded. In yet another embodiment, a hole may be formed in advance through the Al foil 10 and, after bonding of the insulating layer 20, the through-hole 40 may be formed at the insulating layer 20 corresponding to the hole by a chemical method. For descriptive purposes herein, a structure in which the Al foil 10 is bonded to both sides of the insulating layer 20 using the insulating bonding sheet 30 and the through-hole 40 is formed will be referred to as a 'substrate.' A pattern may be formed on the substrate by the through-hole 40.

Although the embodiment in FIGS. 1-3 shows a monolayer substrate formed by bonding the Al foil 10 on both sides of a single insulating layer 20, in other embodiments a multilayer substrate may be applied, formed by preparing a plurality of insulating layers 20 and bonding the Al foil 10 on both sides of each insulating layer 20.

Figure 4:
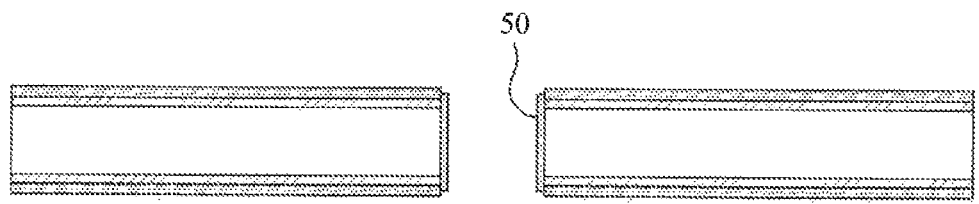

In the embodiment shown in FIG. 4, a metal layer 50 is formed on an inner surface of the through-hole 40 to cover the exposed insulating layer 20 and the insulating bonding sheet 30 within the through-hole 40. The metal layer 50 may be formed by direct plating of a carbon plating layer, where the carbon serves to penetrate into the insulating layer 20 and the insulating bonding sheet 30. The metal layer 50 bridges the Al foils 10 formed at the upper portion and the lower portion of the substrate to provide electrical conductivity therebetween.

Figure 5:
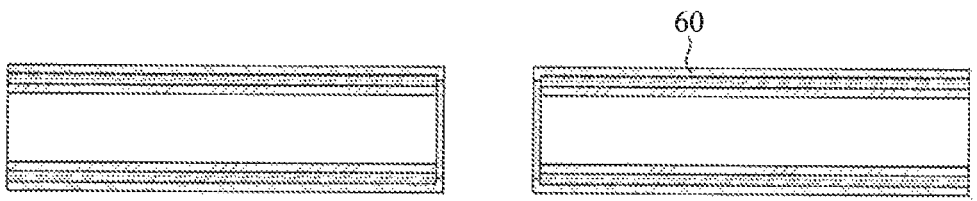

In the embodiment shown in FIG. 5, zincate processing may be performed with reference to the metal layer 50, thereby replacing a predetermined thickness of the surface of the Al foil 10 with a zinc (Zn) layer 60. As the zincate processing is performed, a side surface of the Al foil 10 exposed through the inner surface of the through-hole 40 of the substrate, excluding the metal layer 50, may be selectively replaced with the Zn film 60. That is, during the zincate processing, part of the surface of the Al foil 10 is replaced with the Zn film 60 as shown in FIG. 5. The zincate processing refers to a method of replacing a surface of metal having a high oxidation potential with Zn, which has a lower oxidation potential. In FIG. 5, the surface of the Al is replaced with Zn.

Since the surface of the Al foil 10 is replaced with the Zn film 60 through the zincate processing, a contacting force of the surface of the Al foil 10 may be increased during electrolytic reduction plating or electroplating.

Figure 6:
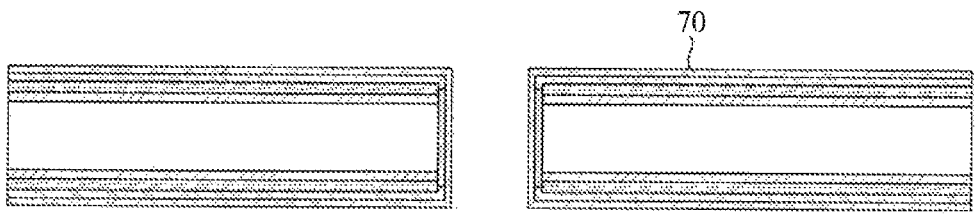

In the embodiment shown in FIG. 6, electrolytic reduction plating is performed to form a metal film having high chemical resistance with respect to the Zn film 60. For example, a nickel (Ni) film 70 is formed on the metal layer 50 and on the Zn film 60 by performing electroplating using Ni. the advantage of the Ni film 70 is that the Ni film 70 may be formed by electrolyzing (restoration) at a relatively lower production cost compared to other electrolytic reduction plating methods. In FIG. 6, the Ni film 70 may be formed by performing Ni electrolyzing (restoration) with respect to the Zn film 60. However, depending on conditions, the Zn film 60 may be replaced with the Ni film 70, where an entire or only a partial thickness of a surface of the Zn film 60 may be replaced with the Ni film 70. Therefore, even after the Ni displacement plating, part of the Zn film 60 may remain on the surface of the Al foil 10.

When the plating of the Zn film 60 is performed, another metal having high chemical resistance may be used instead of Ni. For example, gold (Au) or silver (Ag) may be used. However, in consideration of material cost, it is exemplary to use Ni for the plating of the Zn film 60.

In the exemplary embodiments, bonding between the Zn film 60 and a copper (Cu) plating film 80 is increased by forming the Ni film 70. Since bonding between Zn and Ni and between Ni and Cu is higher than bonding between Zn and Cu, when the Ni film 70 is formed between the Zn film 60 and the Cu plating film 80, corrosion of the Zn film 60 may be prevented while simultaneously increasing bonding and surface strength.

Figure 7:
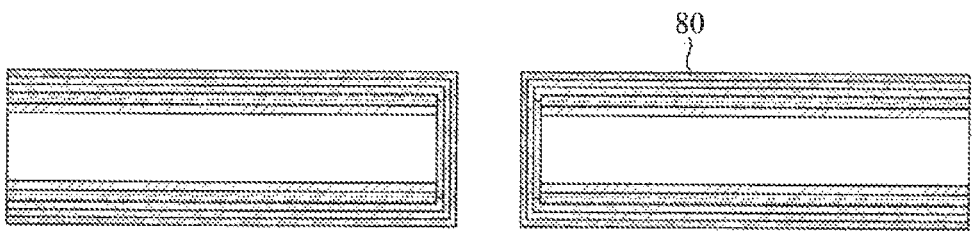

In the embodiment shown in FIG. 7, a plating film 80 may be formed by electroplating or electrolytic reduction plating on a surface of the Ni film 70, including the surface of the through-hole 40. The plating film 80 may be a Cu film formed by electroplating. The plating film 80 may be formed to a thickness of about 20 µm or more. The thickness of the plating film 80 may be controlled according to electroplating methods known to those of ordinary skill in the art. An advantage of using electroplating or electrolytic reduction plating is that production costs may be reduced while increasing quality and strength of the film.

According to an exemplary embodiment, since the surface of the Al foil 10 and the inner surface of the through-hole 40 include the Ni film 70, the entire film is conductive, allowing electroplating to be performed. When electrolytic reduction plating is performed, replacement occurs between palladium (Pd) used as a catalyst and Zn, accordingly producing a large amount of hydrogen. Furthermore, a compound of Pd and Zn is generated, which contaminates the plating solvent. Conversely, when electro plating is performed, problems caused by hydrogen generation and Pd/Zn contamination are minimized in by use of electroless plating.

Figure 8:
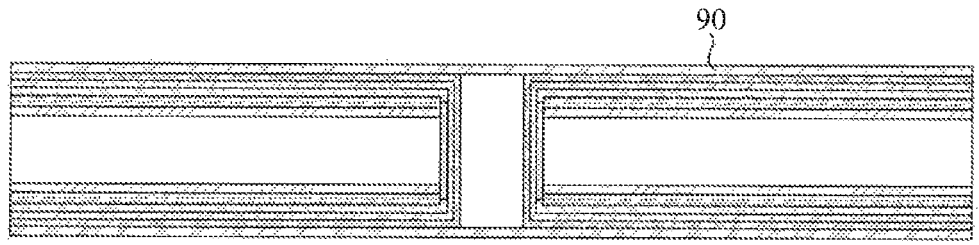
Figure 9:
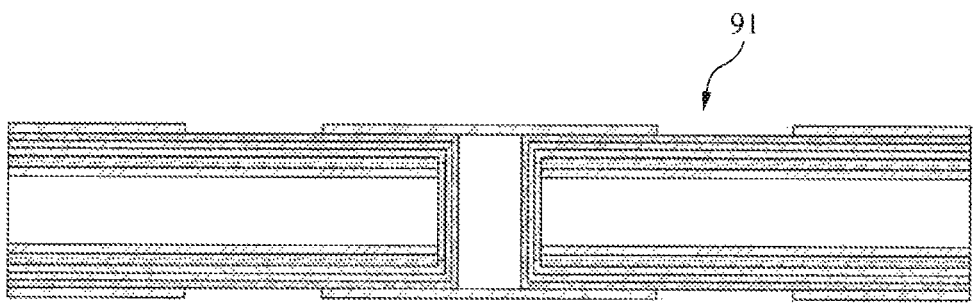

In the embodiment shown in FIG. 8, a dry film 90 is applied to a surface of the plating film 80. In the embodiment shown in FIG. 9, an engraving film is matched and exposure light is supplied for a predetermined time, thereby developing a desired pattern 91.

Figure 10:
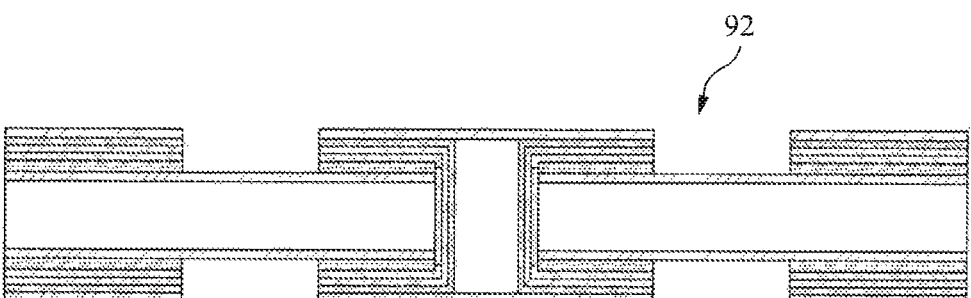

In the embodiment shown in FIG. 10, based on the dry film 90 remaining on the surface of the plating film 80, acid etching may be performed with respect to the pattern 91, using chloride based materials such as ferric chloride (FeC13), copper chloride (CuC12), sodium hypochlorite (NaOCl), and other similar materials known to those of ordinary skill in the art. Through the acid etching, the Zn film 60, the Ni film 70, the plating film 80, and the Al foil 10 are removed, thereby forming a hole 92 in which a circuit desired by a user is to be formed.

Figure 11:
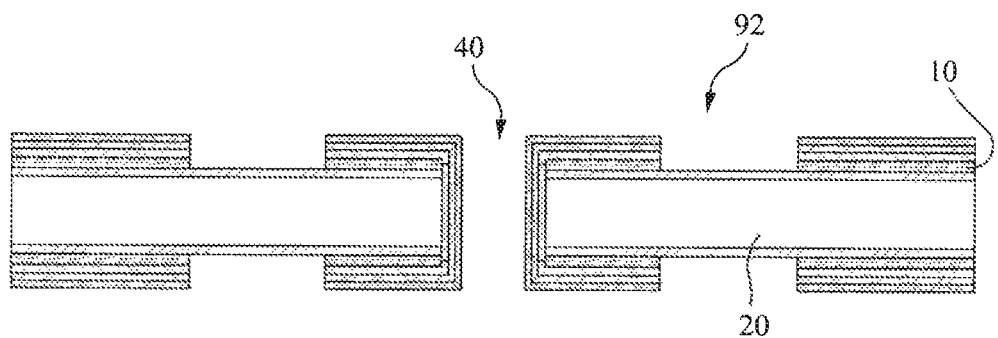

In the embodiment shown in FIG. 11, the dry film 90 is stripped, and the plating film is formed by paneling and the desired circuit is formed.

Although exemplary embodiments of the present invention have been shown and described above, the present invention is not limited to the described embodiments. Instead, those of ordinary skill in the art would appreciate that changes may be made to these embodiments without departing from the principles and spirit of the invention, the scope of which is defined by the claims and their equivalents.

The disclosure has been described with reference to particular exemplary embodiments, but variations within the spirit and scope of the disclosure will occur to those skilled in the art. For example, a proper result may be accomplished even when the described techniques are performed in different order and/or the described system, structure, apparatus, circuit and the like are connected or combined in different manners from the above or replaced with other components or equivalents.

Accordingly, other embodiments and equivalents to claims are within a scope of claims.

What is claimed is:

1. A printed circuit board comprising:
a substrate having
an insulating layer,
aluminum foil layers disposed on both sides of the insulating layer, and
a through-hole formed in the insulating layer and aluminum foil layers;
a metal layer disposed over an exposed surface of the insulating layer positioned along an inner surface of the through-hole;
a zinc film positioned on a surface of the aluminum foil;
a metal film disposed over the zinc film;
a plating film disposed on a surface of the metal film; and
a circuit pattern etched through the aluminum foil and the plating film.

2. The printed circuit board of claim 1, wherein the aluminum foil has a chemically etched surface roughness.

3. The printed circuit board of claim 1, further comprising a bonding material positioned between the aluminum foil and the insulating layer.

4. The printed circuit board of claim 3, wherein the bonding material comprises a polyimide-based or epoxy-based bonding sheet.

5. The printed circuit board of claim 3, wherein the metal layer is formed on an exposed surface of the bonding material along the inner surface of the through-hole.

6. The printed circuit board of claim 1, wherein the substrate is multilayered, having a plurality of insulating layers and aluminum foil disposed on both sides of each insulating layer.

7. The printed circuit board of claim 1, wherein the metal layer is a carbon plating layer.

8. The printed circuit board of claim 1, wherein the metal film is a nickel film.

9. The printed circuit board of claim 1, wherein the plating film has an electroplated structure.

10. The printed circuit board of claim 1, wherein the printed circuit board is mounted to an electrical part of a vehicle.

11. The printed circuit board of claim 1, wherein the metal film is further disposed over the metal layer.

12. A manufacturing method for a printed circuit board comprising the steps of:
(a) preparing an aluminum foil;
(b) bonding the aluminum foil to both sides of an insulating layer;
(c) forming a through-hole passing through the aluminum foil and the insulating layer;
(d) forming a metal layer by depositing metal on an exposed portion of an inner surface of the through-hole on the insulating layer;
(e) replacing a surface of the aluminum foil with a zinc (Zn) film;
(f) forming a metal film by performing plating with respect to surfaces of the metal layer and the Zn film; and
(g) forming a plating film on a surface of the metal film by plating.

13. The manufacturing method of claim 12, wherein the step (a) comprises forming roughness on the aluminum foil by etching.

14. The manufacturing method of claim 13, wherein the etching is performed by alkali-based or acid-based chemical processing.

15. The manufacturing method of claim 12, wherein the step (b) comprises bonding of the aluminum foil and the insulating layer using a bonding material that absorbs thermal expansion of the aluminum foil.

16. The manufacturing method of claim 15, wherein the bonding material comprises a polyimide-based or epoxy-based bonding sheet.

17. The manufacturing method of claim 15, wherein the bonding is performed by heating or pressurizing an upper portion and a lower portion of the aluminum foil.

18. The manufacturing method of claim 15, wherein the metal layer is formed on the exposed portion of the bonding material exposed in the inner surface of the through-hole.

19. The manufacturing method of claim 12, wherein the metal layer of the step (d) comprises a carbon plating layer.

20. The manufacturing method of claim 12, wherein the metal film of the step (f) is formed by electrolytic reduction plating.

21. The manufacturing method of claim 12, wherein the step (g) comprises forming the plating film using electroplating.

22. The manufacturing method of claim 12, further comprising a step (h) of forming a circuit pattern on a surface of the plating film.

23. The manufacturing method of claim 22, wherein the circuit pattern is formed by acid etching the plating film and the aluminum foil using a chloride based material.

24. The manufacturing method of claim 23, wherein the chloride based material comprises at least one of ferric chloride, copper chloride, and sodium hypochlorite.

25. The manufacturing method of claim 12, wherein a multilayer printed circuit board is formed by repeating the step (a) and the step (b).

* * * * *